United States Patent
Geusic et al.

(10) Patent No.: US 6,313,531 B1
(45) Date of Patent: *Nov. 6, 2001

(54) COAXIAL INTEGRATED CIRCUITRY INTERCONNECT LINES, AND INTEGRATED CIRCUITRY

(75) Inventors: Joseph E. Geusic, Berkeley Heights, NJ (US); Kie Y. Ahn, Chappaqua, NY (US); Leonard Forbes, Corvallis, OR (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/118,346

(22) Filed: Jul. 17, 1998

Related U.S. Application Data

(62) Division of application No. 08/917,449, filed on Aug. 22, 1997.

(51) Int. Cl.$^7$ .................................................. H01L 23/48
(52) U.S. Cl. ........................... 257/734; 257/621; 257/774
(58) Field of Search .................................... 257/401, 734, 257/330, 397, 520, 665, 774, 621

(56) References Cited

U.S. PATENT DOCUMENTS

| | | |
|---|---|---|
| 3,982,268 | 9/1976 | Anthony et al. ........................ 357/55 |
| 4,394,712 | 7/1983 | Anthony ................................ 361/411 |
| 4,419,150 | 12/1983 | Soclof .................................... 148/187 |
| 4,440,973 | 4/1984 | Hawkins . | |
| 4,595,428 | 6/1986 | Anthony et al. ...................... 148/187 |

(List continued on next page.)

FOREIGN PATENT DOCUMENTS 4-133472   5/1992   (JP) .

OTHER PUBLICATIONS

V. Lehmann, "The Physics of Macropore Formation in Low Doped N–Type Silicon," *J. Electrochem. Soc.*, vol. 140, No. 10, Oct. 1993, pp. 2836–2843.

(List continued on next page.)

*Primary Examiner*—Wael Fahmy
*Assistant Examiner*—Roy Potter
(74) *Attorney, Agent, or Firm*—Wells, St. John, Roberts, Gregory & Matkin, P.S.

(57) ABSTRACT

Methods of forming integrated circuitry lines such as coaxial integrated circuitry interconnect lines, and related integrated circuitry are described. An inner conductive coaxial line component is formed which extends through a substrate. An outer conductive coaxial line component and coaxial dielectric material are formed, with the coaxial dielectric material being formed operably proximate and between the inner and outer conductive coaxial line components. In a preferred implementation, the substrate includes front and back surfaces, and a hole is formed which extends through the substrate and between the front and back surfaces. In one implementation, the outer conductive coaxial line component constitutes doped semiconductive material. In another implementation, such constitutes a layer of metal-comprising material. A layer of dielectric material is formed over and radially inwardly of the outer line component. Conductive material is then formed over and radially inwardly of the dielectric material layer. The latter conductive material constitutes an inner conductive coaxial line component. In a preferred implementation, the inner conductive coaxial line component is formed by forming a first material within the hole. A second conductive material is formed over the first material. Subsequently, the substrate is exposed to conditions which are effective to cause the second material to replace the first material.

5 Claims, 7 Drawing Sheets

U.S. PATENT DOCUMENTS

| | | | |
|---|---|---|---|
| 4,610,077 | 9/1986 | Minahan et al. | 29/572 |
| 4,776,087 | 10/1988 | Cronin et al. | |
| 4,870,470 * | 9/1989 | Bass, Jr. et al. | 357/40 |
| 4,933,743 | 6/1990 | Thomas et al. | 357/71 |
| 4,939,568 | 7/1990 | Kato et al. | |
| 4,977,439 | 12/1990 | Esquivel et al. | 357/49 |
| 5,148,260 | 9/1992 | Inoue et al. | |
| 5,166,097 | 11/1992 | Tanielian | 437/203 |
| 5,312,765 | 5/1994 | Kanber. | |
| 5,317,197 * | 5/1994 | Roberts | 257/401 |
| 5,424,245 | 6/1995 | Gurtler et al. | |
| 5,426,072 | 6/1995 | Finnila | 437/208 |
| 5,482,873 | 1/1996 | Yang | 437/31 |
| 5,528,080 | 6/1996 | Goldstein. | |
| 5,539,227 | 7/1996 | Nakano. | |
| 5,539,256 | 7/1996 | Mikagi. | |
| 5,587,119 * | 12/1996 | White | 264/104 |
| 5,596,230 | 1/1997 | Hong. | |
| 5,599,744 | 2/1997 | Koh et al. | 437/195 |
| 5,608,237 | 3/1997 | Aizawa et al. | |
| 5,614,743 | 3/1997 | Mochizuki. | |
| 5,618,752 | 4/1997 | Gaul | 438/626 |
| 5,635,423 | 7/1997 | Huang et al. | |
| 5,640,049 | 6/1997 | Rostoker et al. | 257/758 |
| 5,646,067 | 7/1997 | Gaul | 437/180 |
| 5,661,344 | 8/1997 | Havemann et al. | |
| 5,682,062 * | 10/1997 | Gaul | 257/686 |
| 5,698,867 | 12/1997 | Bauer et al. | |
| 5,699,291 * | 12/1997 | Tsunemine | 365/149 |
| 5,717,247 | 2/1998 | Koh et al. | 257/686 |
| 5,750,436 | 5/1998 | Yamaga et al. | |
| 5,753,529 | 5/1998 | Chang et al. | 437/67 |
| 5,767,001 | 6/1998 | Bertagnolli et al. | 438/455 |
| 5,807,783 | 9/1998 | Gaul et al. | 438/406 |
| 5,811,868 * | 9/1998 | Bertin et al. | 257/516 |
| 5,817,572 | 10/1998 | Chiang et al. | |
| 5,827,775 | 10/1998 | Miles et al. | |
| 5,841,197 | 11/1998 | Adamic, Jr. | |
| 5,852,320 | 12/1998 | Ichihashi | 257/419 |
| 5,858,877 | 1/1999 | Dennison et al. | |
| 5,869,893 | 2/1999 | Koseki et al. | |
| 5,930,625 | 7/1999 | Lin et al. | |
| 5,933,758 | 8/1999 | Jain. | |
| 5,990,562 | 11/1999 | Vallett. | |
| 6,001,538 | 12/1999 | Chen et al. | |
| 6,037,244 | 3/2000 | Gardner et al. | |
| 6,037,248 | 3/2000 | Ahn. | |

OTHER PUBLICATIONS

K.P. Muller et al., "Trench Storage Node Technology for Gigabit DRAM Generations," *Technical Digest of International Electron Devices Meeting*, Dec. 8–11, 1996, pp. 507–510.

H. Horie et al., "Novel High Aspect Ratio Plug for Logic/DRAM LSIs Using Polysilicon–Aluminum Substitute (PAS)," *Technical Digest of International Electron Devices Meeting*, Dec. 8–11, 1996, pp. 946–948.

U.S. application No. 08/917,003, Ahn, filed Aug. 27, 1997.

U.S. application No. 08/917,443, Ahn, filed Aug. 22, 1997.

U.S. application No. 08/917,449, Geusic et al., filed Aug. 22, 1997.

U.S. application No. 09/095,774, Ahn, filed Jun. 10, 1998.

Low and High Dielectric Constant Thin Films for Integrated Circuit Applications, R.J. Gutmann, et al., Oct. 3–5, 1996, 6 pgs.

VLSI Multilevel Micro–Coaxial Interconnects for High Speed Devices, M.E. Thomas, I.A. Saadat & S. Sekigahama, IEEE 1990, pp. 90–55—90–58.

Selective Chemical Vapor Deposition of Tungsten Using Silane and Polysilane Reductions, T. Ohba, T. Suzuki, T. Hara, Y. Furumura, & K. Wada, 1989 Materials Research Society, 9 pgs.

High Rate Low–Temperature Selective Tungsten, R.F. Foster, S. Tseng, L. Lane & K.Y. Ahn, 1988 Materials Research Society, 4 pgs.

Evaluation on Selective Deposition of CVD W Films by Measurement of Surface Temperature, T. Ohba, Y. Ohyama, S. Inoue, & M. Maeda, 1987 Materials Research Society, 8 pgs.

Sekine, M., "A New High–Density Plasma Etching System Using A Dipole–Ring Magnet," *Jpn. J. Appl. Phys.*, Nov. 1995, Pt. 1, No. 11.

"Polymers for high performance interconnects" K.J. Tayler et al.; Materials for Avanced Metallization, 1997, pp. 59–63.

K.J. Taylor, et al., "Polymers for high performance interconnects", Mar., 1997, Materials for Advanced Metallization, pp. 59–63.

\* cited by examiner

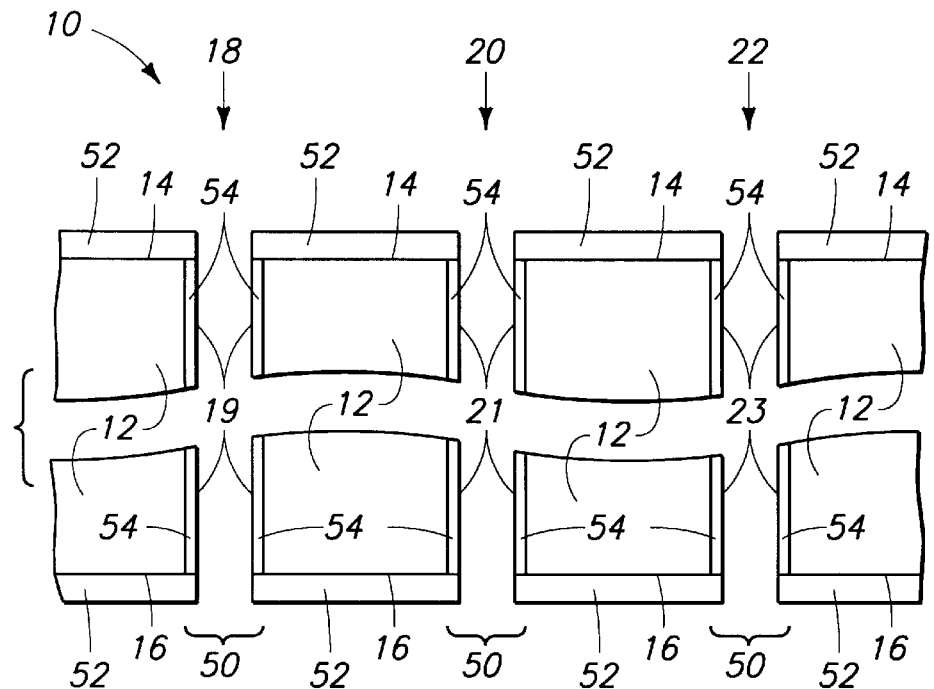
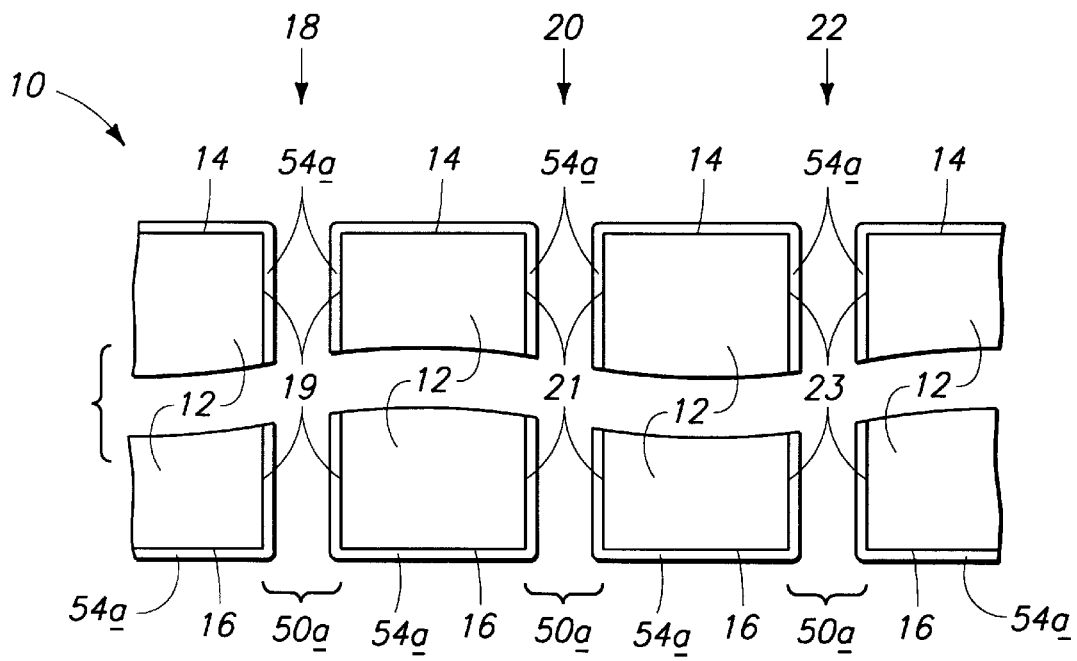

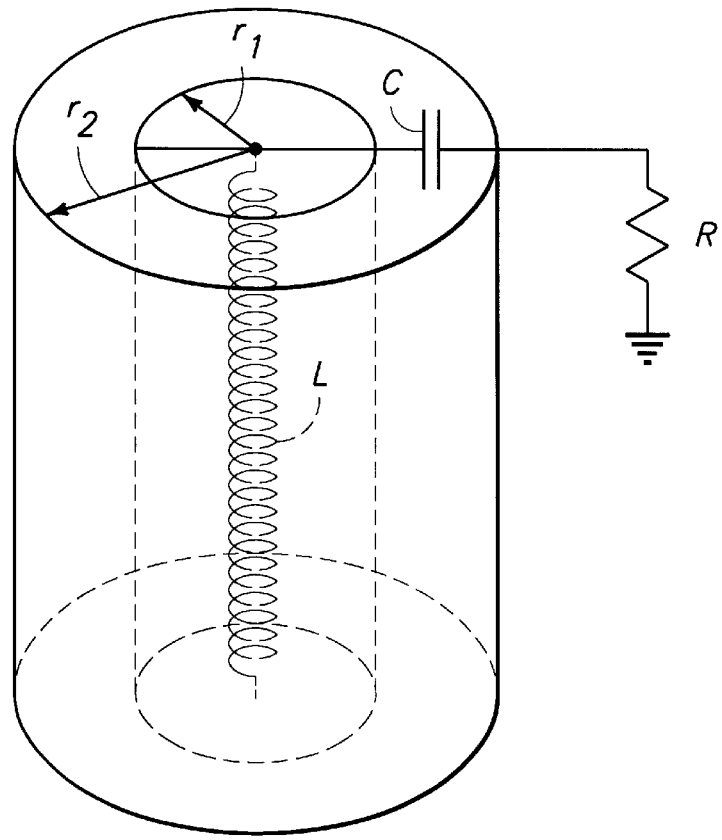
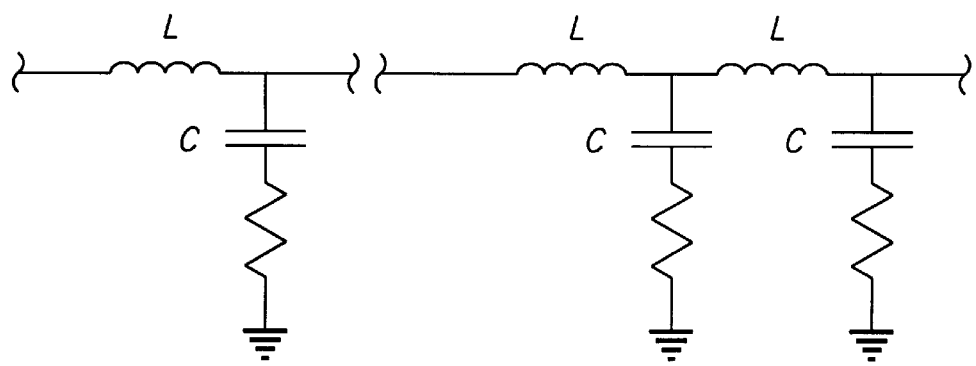
$Z_O = \sqrt{\dfrac{z}{y}}$ , where $Z = jwL$ and $Y = jwC \left( \dfrac{1}{1+jwRC} \right)$
$L = \dfrac{\mu}{2\pi} \ln \left( \dfrac{r_2}{r_1} \right)$
$C = 2\pi \, \epsilon_r \, \epsilon_o \left[ \ln \left( \dfrac{r_2}{r_1} \right) \right]^{-1}$
$\boxed{Z_O = 377\Omega}$
FIG. 13

COAXIAL INTEGRATED CIRCUITRY INTERCONNECT LINES, AND INTEGRATED CIRCUITRY

RELATED PATENT DATA

This patent resulted from a divisional application of U.S. patent application Ser. No. 08/917,449, filed Aug. 22, 1997, entitled "Methods of Forming Coaxial Integrated Circuitry Interconnect Lines, and Integrated Circuitry", naming Joseph E. Geusic, Kie Y. Ahn, and Leonard Forbes as inventors, and which is now pending the disclosure of which is incorporated by reference.

TECHNICAL FIELD

This invention relates to methods of forming coaxial integrated circuitry interconnect lines, to integrated circuitry, and to other co-axial line formation.

BACKGROUND OF THE INVENTION

Semiconductor devices are typically fabricated on a wafer which is subsequently tested and separated into individual dies or chips. Individual dies are then packaged. Packaged chips are then assembled together, typically on a printed circuit board (PCB), and electrically interconnected to perform a desired function. The electrical interconnection of separately fabricated chips generally takes place externally of the individual chips. While PCB techniques are useful for bringing together separately fabricated and assembled chips, doing so brings with it some problems which are not so easily overcome. For example, PCBs consume a large amount of physical space compared to the circuitry of the chips which are mounted to them. It is desirable to reduce the amount of physical space required by such PCBs. Further, assuring the electrical integrity of interconnections between chips mounted on PCBs is a challenge. Moreover, in certain applications, it is desirable to reduce the physical length of electrical interconnections between devices because of concerns with signal loss or dissipation and interference with and by other integrated circuitry devices.

A continuing challenge in the semiconductor industry is to find new, innovative, and efficient ways of forming electrical connections with and between circuit devices which are fabricated on the same and on different wafers or dies. Relatedly, continuing challenges are posed to find and/or improve upon the packaging techniques utilized to package integrated circuitry devices. As device dimensions continue to shrink, these challenges become even more important.

This invention arose out of concerns associated with improving the manner in which electrical connections are formed relative to integrated circuitry devices. More particularly, this invention arose out of concerns associated with improving the manner in which electrical interconnections are formed relative to the same or different wafers or dies. Yet, certain aspects of the invention are seen to be applicable outside of the semiconductor processing industry, with the invention only being limited by the accompanying claims appropriately interpreted in accordance with the doctrine of equivalents.

SUMMARY OF THE INVENTION

Methods of forming integrated circuitry lines such as coaxial integrated circuitry interconnect lines, and related integrated circuitry are described. A semiconductive substrate is provided. In one aspect, an inner conductive coaxial line component is formed which extends through the substrate. An outer conductive coaxial line component and coaxial dielectric material are formed, with the coaxial dielectric material being formed operably proximate and between the inner and outer conductive coaxial line components. In a preferred implementation, the substrate includes front and back surfaces, and a hole is formed which extends through the substrate and between the front and back surfaces. The hole is defined in part by an interior wall portion. Conductive material is formed proximate at least some of the interior wall portion. In one implementation, the conductive material constitutes semiconductive material which is doped with a conductivity-enhancing impurity. In another implementation, the conductive material constitutes a layer of metal-comprising material which is formed within the hole. Subsequently, a layer of dielectric material is formed within the hole, over and radially inwardly of the conductive material. Conductive material is then formed within the hole over and radially inwardly of the dielectric material layer. The latter conductive material constitutes an inner conductive coaxial line component.

In a preferred implementation, the inner conductive coaxial line component is formed by forming a first material within the hole. A second material is formed over the first material, with at least the second material being conductive. Subsequently, the substrate is exposed to conditions which are effective to cause the second material to replace the first material.

BRIEF DESCRIPTION OF THE DRAWINGS

Preferred embodiments of the invention are described below with reference to the following accompanying drawings.

FIG. 5 is a cross-sectional view of the FIG. 1 semiconductor wafer fragment at a processing step subsequent to that shown by FIG. 2.

FIG. 6 is a cross-sectional view of the FIG. 1 semiconductor wafer fragment at an alternate processing step subsequent to that shown by FIG. 2.

FIG. 13 is a somewhat schematic diagrammatic representation of one aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
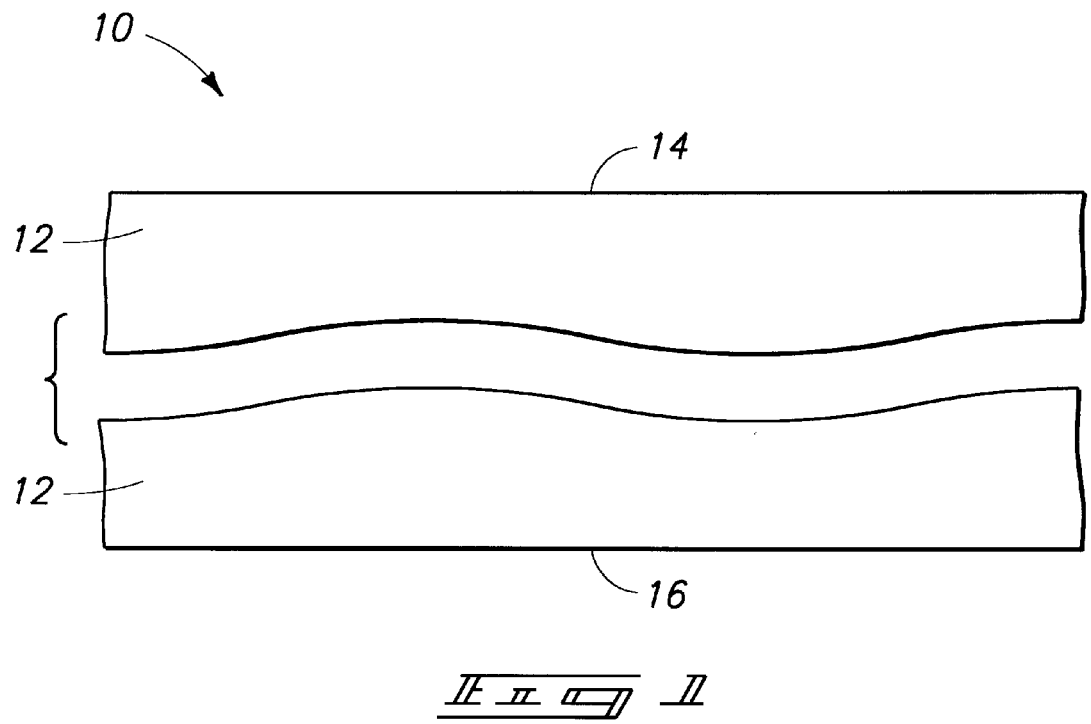
FIG. 1 is a cross-sectional view of a semiconductor wafer fragment at one processing step in accordance with the invention.

Referring to FIG. 1, a semiconductor wafer fragment is indicated generally at 10 and includes a semiconductive substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure such as dies and the like, including, but not limited to, the semiconductive substrates described above. Wafer fragment 10 includes a first or front surface 14 and a second or back surface 16. In one aspect, wafer fragment 10 constitutes a silicon-containing structure having first and second outwardly-facing surfaces 14, 16, at least one of which is capable of supporting integrated circuitry. In a preferred aspect of the invention, silicon-containing structure or substrate 12 constitutes an n-type monocrystalline silicon wafer. It will be understood that other types of structures, which are not necessarily silicon-containing structures, can be utilized.

Figure 2:
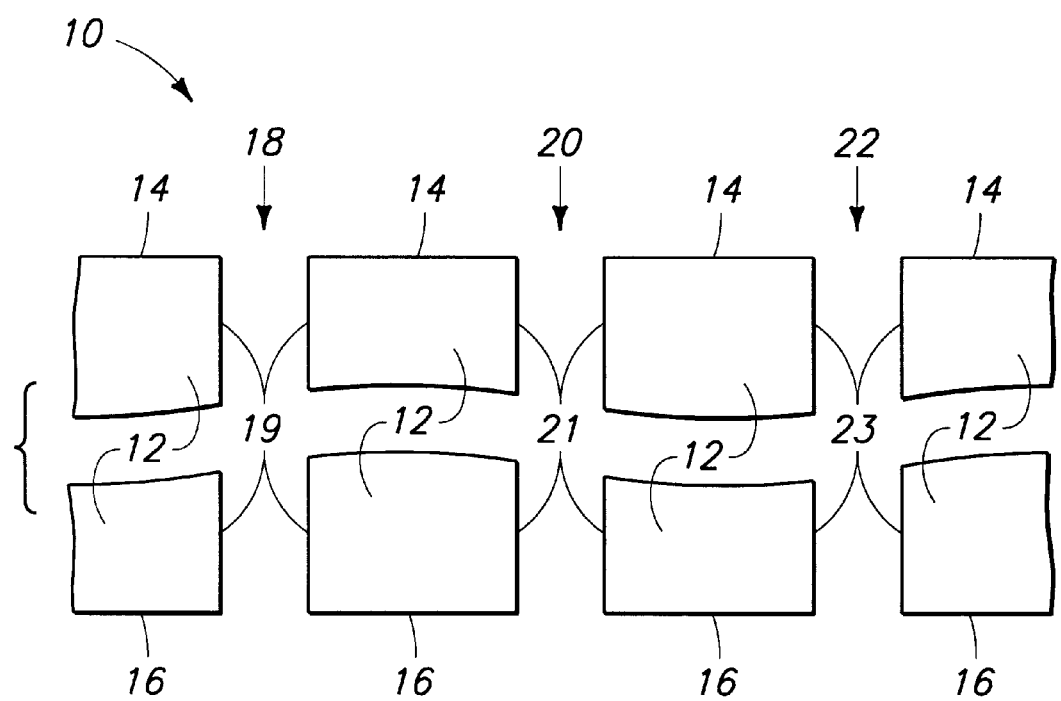
FIG. 2 is a cross-sectional view of the FIG. 1 semiconductor wafer fragment at a processing step subsequent to that shown by FIG. 1.

Referring to FIG. 2, a plurality of holes or passageways 18, 20, and 22 are formed within substrate 12 between front and back surfaces 14, 16. Each hole or passageway is defined, at least in part, by a respective interior wall portion 19, 21, and 23. The illustrated interior wall portions constitute interior hole surfaces which join with first and second surfaces 14, 16. Accordingly, the illustrated interior hole surfaces are disposed within the silicon-containing structure comprising substrate 12. Holes 18, 20, and 22 can be formed through any suitable processing techniques, with one being described below with reference to FIGS. 3 and 4. In one aspect, such holes are formed to have very high aspect ratios (depth-to-width ratios). Exemplary aspect ratios can be greater than about 100. More preferably, aspect ratios can be greater than about 200.

Figure 3:
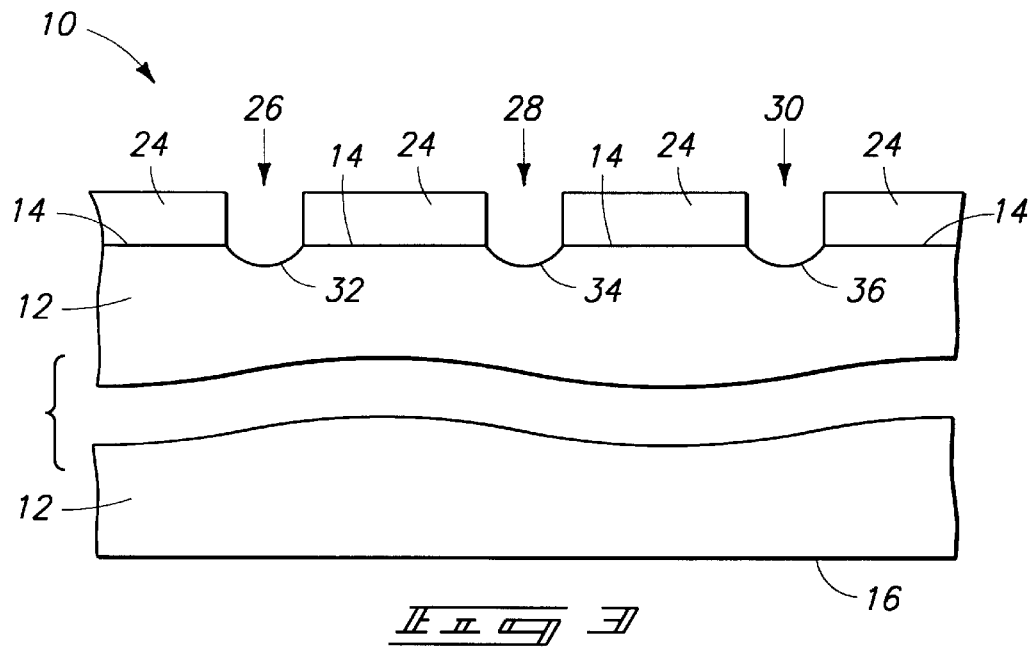
FIG. 3 is a cross-sectional view of the FIG. 1 semiconductor wafer fragment at a processing step subsequent to that shown by FIG. 1.

Referring to FIG. 3, substrate 12 is shown at a processing step which follows the FIG. 1 construction and precedes the FIG. 2 construction. A layer 24 of masking material, such as photoresist, is formed over front surface 14 as shown and suitably patterned to define a plurality of openings 26, 28, and 30. Openings 26, 28, and 30 are formed elevationally over a substrate area in which holes 18, 20, and 22 (FIG. 2) are to be formed. Preliminarily, an alkaline etch can be conducted which is effective to form a pattern of pre-defined etch pits 32, 34, and 36. Subsequently, masking material layer 24 is stripped away.

Figure 4:
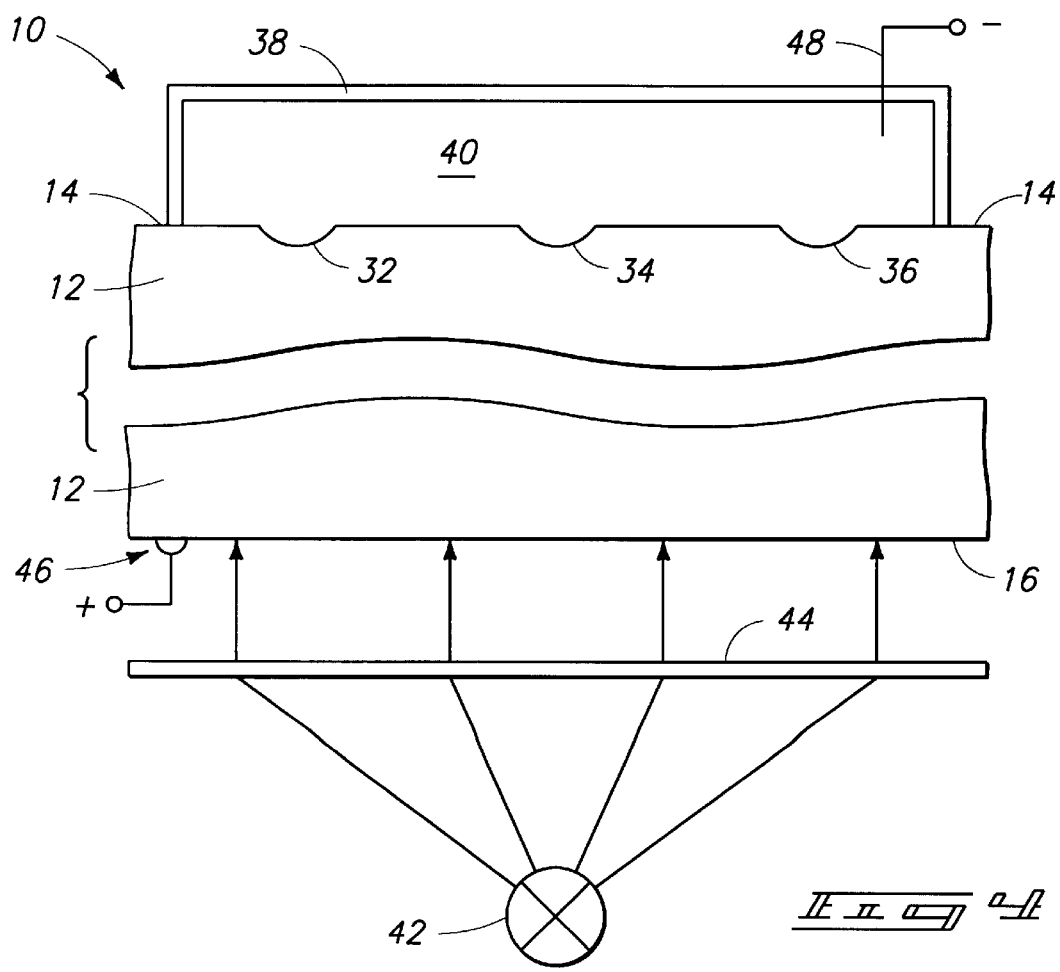
FIG. 4 is a cross-sectional view of the FIG. 1 semiconductor wafer fragment at a processing step subsequent to that shown by FIG. 3.

Referring to FIG. 4, a cover is provided over front surface 14 and etch pits 32, 34, and 36. An HF electrolyte solution 40 is provided over front surface 14 and etch pits 32, 34, and 36. Cover 38 serves to isolate front surface 14 and provide the solution only thereover. Preferably, front surface 14 is maintained in the dark. To increase the flow of minority carriers at front surface 14, back surface 16 is suitably illuminated. More specifically, a lamp 42 and an optical high-pass filter 44 are utilized to provide a source of illumination which increases the flow of minority carriers at front surface 14. An ohmic contact 46 can be provided relative to surface 16 and a platinum wire 48 can be provided in solution 40 to develop a suitable bias. Accordingly, holes 18, 20, and 22 (FIG. 2) are formed. The above-described processing technique is discussed in more detail in an article entitled "The Physics of Macropore Formation in Low Doped N-Type Silicon" authored by Lehmann and appearing in *J. Electrochem. Soc.*, volume 140, No. 10, October 1993. It will be understood and appreciated by those of skill in the art, that the above processing technique would change if the substrate were, for example, a p-type substrate rather than an n-type substrate. Moreover, it will be understood that holes 18, 20, and 22 can be formed through utilization of other techniques.

Referring to FIG. 5, outer conductive sheaths 50 are formed relative to and within each respective hole 18, 20, and 22. Sheaths 50 extend between respective pairs of oppositely facing openings which define each of the respective holes. In accordance with one aspect of this implementation, a masking layer 52 is formed over the substrate and in particular over front and back surfaces 14, 16. Conductivity enhancing impurity is then provided into the substrate and received by and within internal wall portions or surfaces 19, 21, and 23 to form diffusion regions 54. Accordingly, in this implementation the provision of conductivity enhancing impurity takes place after the formation of holes 18, 20, and 22. Such outer sheaths 50 can also be provided or formed through the inherent doping concentration of the illustrated wafer, or by other substrate doping, prior to formation of the illustrated holes.

In one aspect of the invention, diffusion regions 54 constitute n+ diffusion regions which are formed in the n-type monocrystalline silicon wafer mentioned above. Other diffusion regions can, of course, be utilized in connection with differently doped or profiled wafers. In accordance with this aspect of the invention, outer sheaths 50 will constitute respective outer conductive coaxial line components which comprise semiconductive material which is doped with a suitable conductivity enhancing impurity. Accordingly, diffusion regions 54 constitute a first conductive material which is formed proximate at least a portion of and preferably all of respective interior surfaces or wall portions 19, 21, and 23.

Referring to FIG. 6, an alternate preferred implementation is shown. Such constitutes a construction which follows from the FIG. 2 construction. Like numbers from the FIG. 5 construction are utilized where appropriate with differences being indicated by the suffix "a" or with different numbers. Accordingly, outer conductive sheaths 50a are formed within holes or passageways 18, 20, and 22 and over respective interior wall portions 19, 21, and 23. Sheaths 50a are preferably formed by depositing a layer 54a of metal-comprising material over the substrate, within the holes and over the respective wall portions 19, 21, and 23 thereof. Any suitable method of providing such metal-comprising layer can be utilized. An exemplary method includes a low-pressure chemical vapor deposition (LPCVD) of tungsten in a self-limiting process which provides a tungsten film by silicon reduction. Accordingly, silicon material within holes 18, 20, and 22 is replaced by tungsten atoms in a $WF_6$ reaction gas, with a reaction product $SiF_4$ being pumped out or otherwise removed from the deposition chamber. Subsequently, such can be followed by silane or polysilane reduction of the $WF_6$ until a desired thickness is reached.

Deposition rates in accordance with the above are dependent upon the temperature and the reaction gas flow rate. Exemplary deposition rates have been observed at 1 micron per minute, at temperatures of 300° C. and with a flow rate of $WF_6$ at 4 sccm in a cold wall CVD reactor.

The remaining discussion proceeds with the FIG. 5 construction being utilized to illustrate processing in accordance with the inventive methodologies. It is to be understood, however, that the FIG. 6 construction could be utilized as well.

Figure 7:
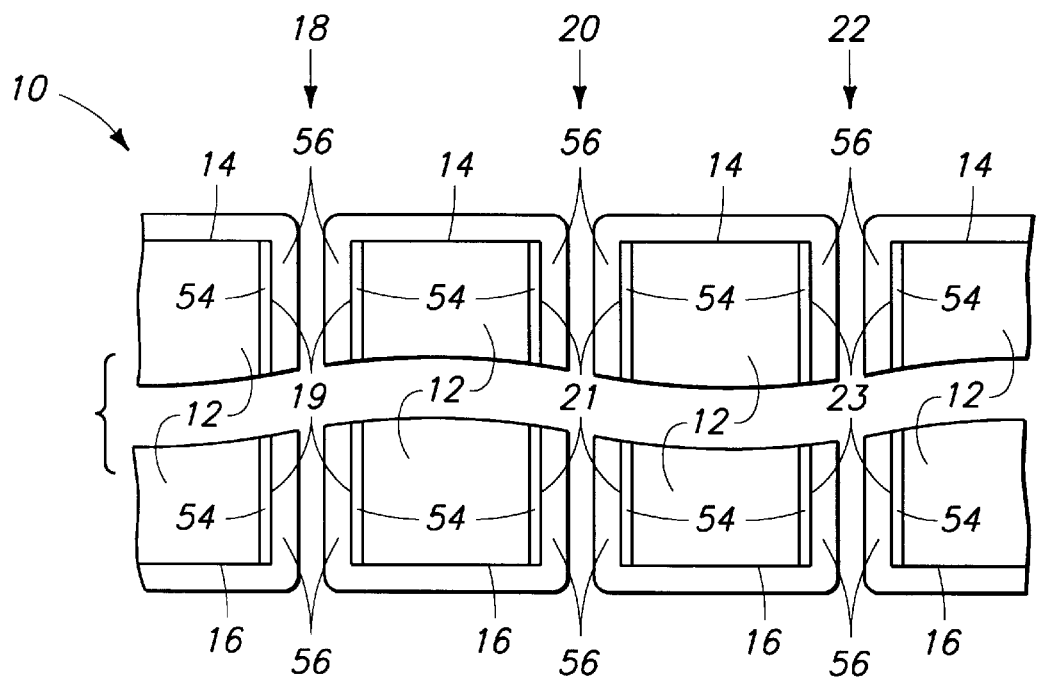
FIG. 7 is a cross-sectional view of the FIG. 5 semiconductor wafer fragment at a processing step subsequent to that shown by FIG. 5.

Referring to FIG. 7, a dielectric material layer 56 is formed over the substrate and within holes 18, 20, and 22. Portions of layer 56 are thereby formed radially inwardly of interior wall portions 19, 21, and 23 and diffusion regions 54. Alternatively, and with reference to the FIG. 6 construction, layer 56 would be formed radially inwardly of and over conductive material forming layer 54a. Dielectric material of layer 56 which is disposed within holes 18, 20, and 22 provides a dielectric material over and radially inwardly of the outer conductive sheath. An exemplary dielectric material is $SiO_2$.

Alternately, layer 56 can comprise a composite of layers. For example, one portion of dielectric layer 56 can comprise a nitride-containing layer which is disposed proximate respective interior wall portions 19, 21, and 23. An oxide-containing layer is formed over the nitride-containing layer to provide a dielectric NO layer 46 within the hole. In a preferred implementation, the nitride layer is formed by chemical vapor deposition, and the oxide layer by exposing the substrate to oxidizing conditions. Specifically, in the preferred implementation, dielectric layers 56 constitute a reoxidized LPCVD nitride film which forms the illustrated and preferred NO dielectric layer. An exemplary processing implementation includes in-situ nitridation in ammonia at 950° C. Low pressure chemical vapor deposition of nitride at 700° C. takes place with dichlorosilane and ammonia until about two-thirds of the hole diameter is filled (not shown to scale). Subsequently, reoxidation of the nitride takes place at a temperature of between 900° C. to 950° C. Alternatively, fast thermal processing (FTP) can implement the above-described processing steps into a single processing run. Exemplary processing systems and methods are described in an article entitled "Trench Storage Node Technology for Gigabit DRAM Generations", Technical Digest of International Electron Devices Meeting, Dec. 8–11, 1996, pps. 507–510, published by IEEE, Catalog No. 96CH35961 and authored by Muller et al.

Figure 8:
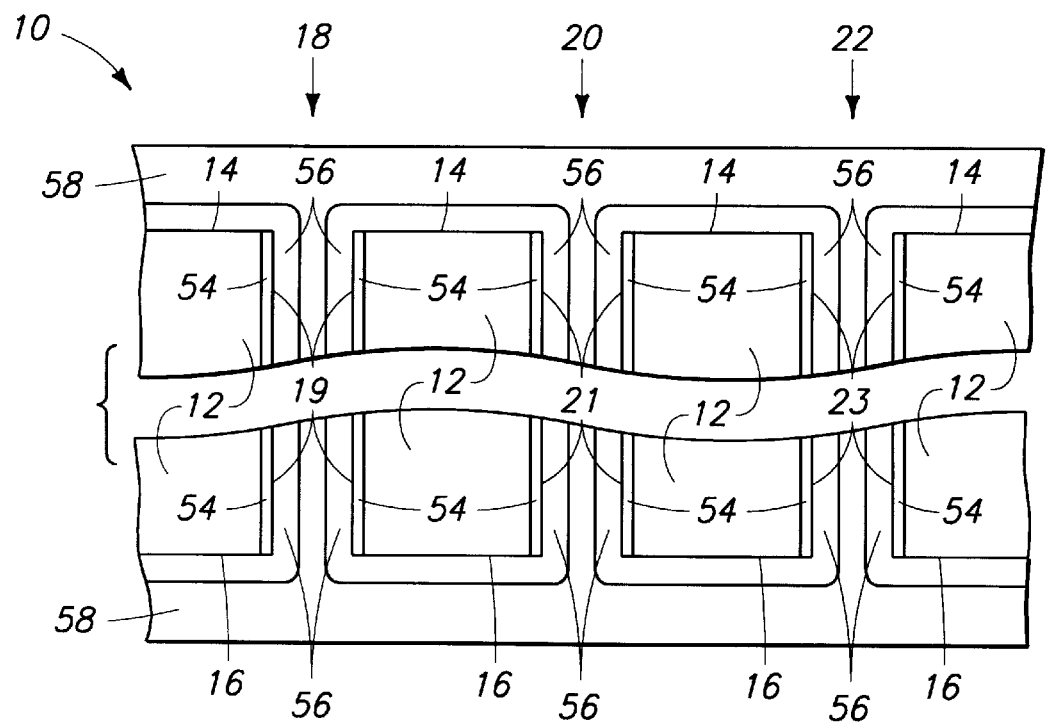
FIG. 8 is a cross-sectional view of the FIG. 5 semiconductor wafer fragment at a processing step subsequent to that shown by FIG. 7.

Referring to FIG. 8, a first layer of material 58 is formed over the substrate and within each respective hole 18, 20, and 22. In a preferred aspect, such first material constitutes polysilicon which is formed through suitable chemical vapor deposition techniques. Accordingly, such first material is formed over and radially inwardly of dielectric material layer 56 within holes 18, 20, and 22.

Figure 9:
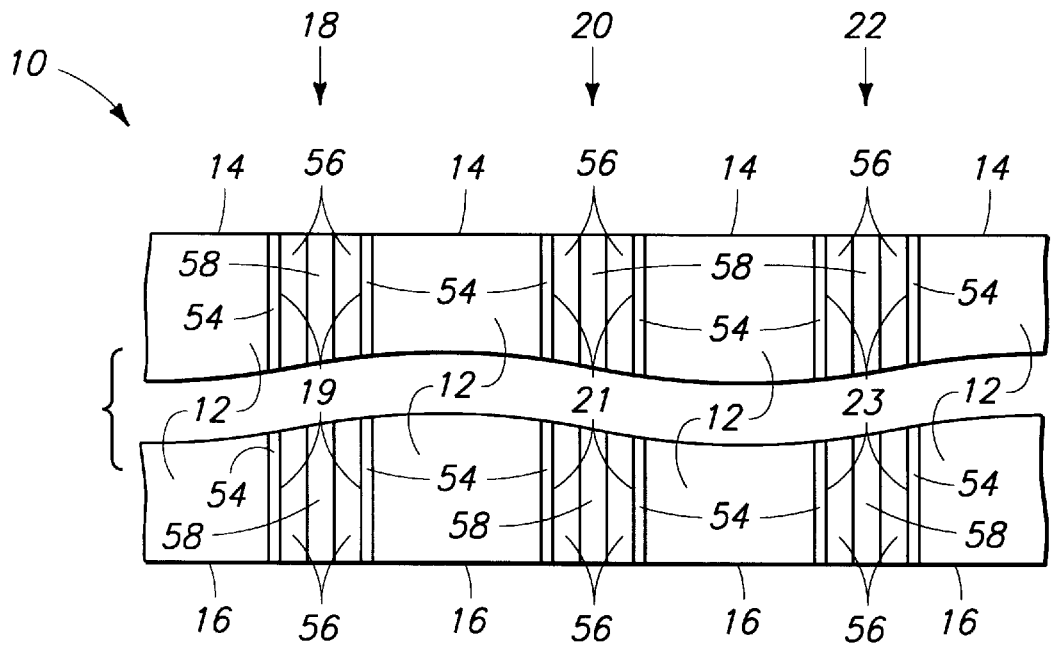
FIG. 9 is a cross-sectional view of the FIG. 5 semiconductor wafer fragment at a processing step subsequent to that shown by FIG. 8.

Referring to FIG. 9, first material 58 is planarized relative to substrate 12 and isolated within respective holes 18, 20, and 22. Such can be accomplished by any suitable processing techniques. Exemplary techniques include abrasion of the substrate as by chemical mechanical polishing.

Figure 10:
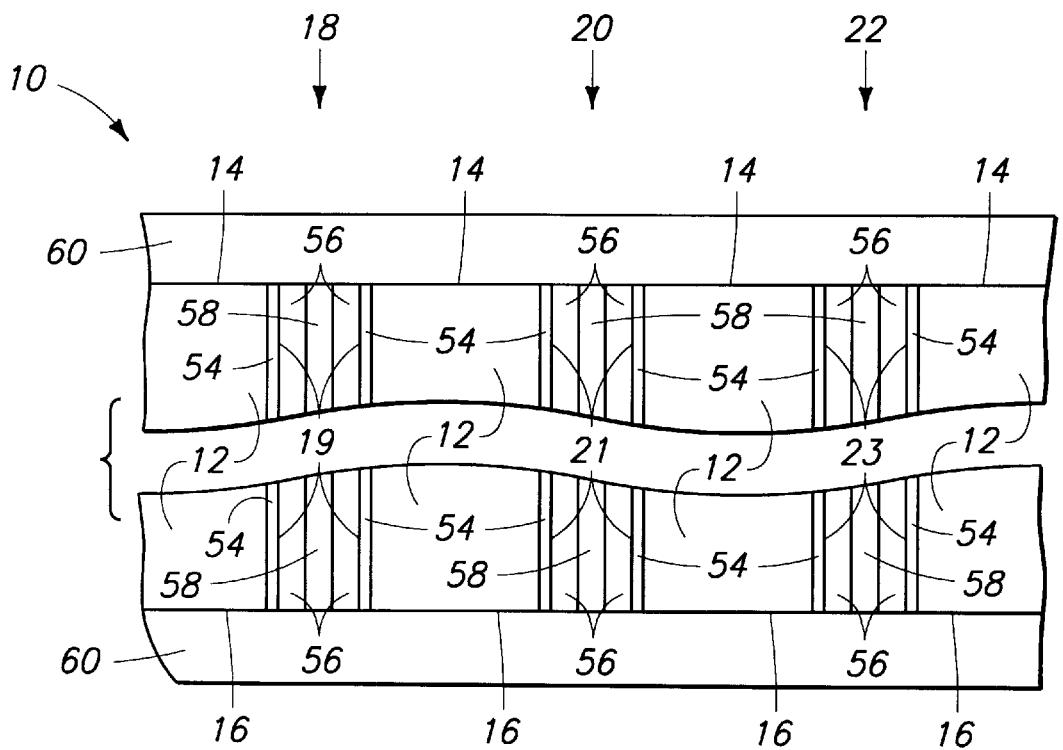
FIG. 10 is a cross-sectional view of the FIG. 5 semiconductor wafer fragment at a processing step subsequent to that shown by FIG. 9.

Referring to FIG. 10, a second layer of material 60 is formed over the substrate and first material 58. In one aspect, second material 60 constitutes a layer comprising a metal material which is different from first material 58. In a preferred aspect, second material 60 constitutes an aluminum-comprising layer of film which is formed over first material 58. Such material or film can be deposited through suitable sputtering or evaporation techniques. Mechanical masks can be utilized to define with more particularity the area over which the preferred aluminum-containing layer of film is deposited. Alternatively, such layer can be blanket deposited and subsequently processed as described below. Second material 60 is preferably deposited over front and back surfaces 14, 16.

Figure 11:
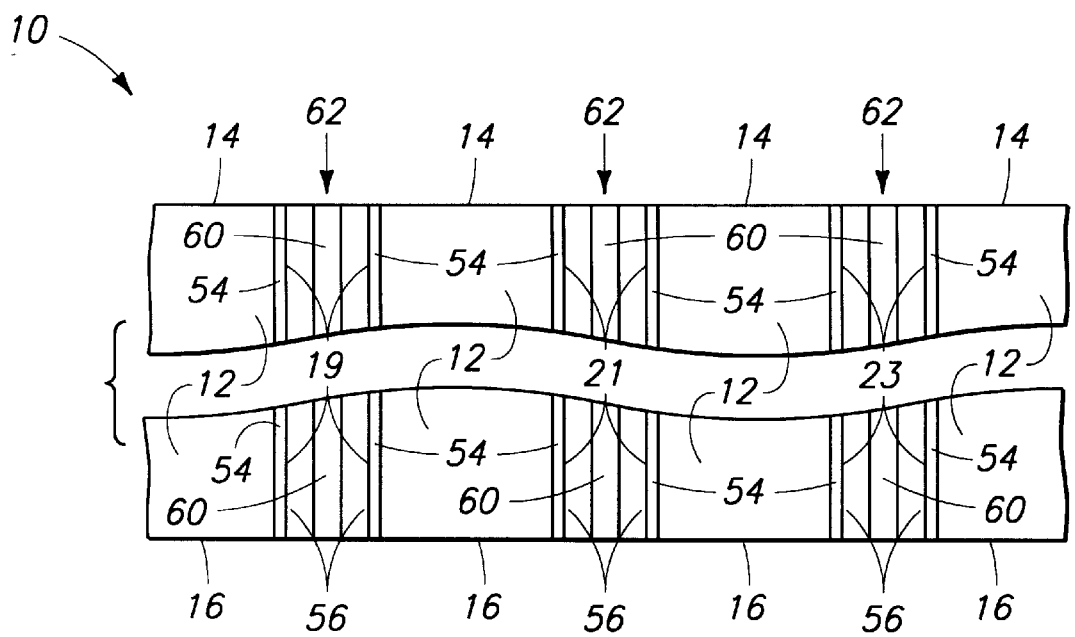
FIG. 11 is a cross-sectional view of the FIG. 5 semiconductor wafer fragment at a processing step subsequent to that shown by FIG. 10.

Referring to FIG. 11, wafer fragment 10 is exposed to processing conditions which are effective to cause second material 60 to replace first material 58. An example includes annealing at 500° C. or greater. The thickness of second material 60 will be determined by the size and dimensions of the interconnecting hole or passageway. As a guideline, and for a 0.175 micron diameter and 1.7 micron deep hole with an aspect ratio of 10, an aluminum thickness of 0.5 microns is sufficient to substitute the preferred polysilicon. Subsequently, any excess aluminum and the substituted-for-polysilicon can be removed through suitable processing techniques such as chemical mechanical polishing. Accordingly, such constitutes replacing the prior-removed semiconductive wafer material with conductive material, and forming a conductive core within the substrate over and radially inwardly of dielectric material layer 56. Exemplary processing methods are described in an article entitled "Novel High Aspect Ratio Plug for Logic/DRAM LSIs Using Polysilicon-Aluminum Substitute (PAS)", Technical Digest of International Electron Devices Meeting, Dec. 8–11, 1996, pps. 946–8, published by IEEE, Catalog No. 96CH35961 and authored by Horie et al.

Processing methodologies described above permit a coaxial integrated circuitry interconnect line to be formed. In a preferred aspect of the invention, the coaxial integrated circuitry interconnect line extends entirely through a wafer, substrate, or die. Exemplary interconnect lines are shown at 62. Exemplary coaxial interconnect lines include an outer conductive coaxial line component having a first thickness proximate the semiconductive substrate. An inner conductive coaxial line component has a second thickness. Coaxial dielectric material, such as that described above, is disposed between and operably proximate the inner and outer conductive coaxial line components. In a preferred implementation, the dielectric material has a substantially uniform third thickness which is greater than at least one of the first and second thicknesses. In another implementation, the outer conductive coaxial line component is formed prior to the forming of the inner conductive coaxial line component.

Figure 12:
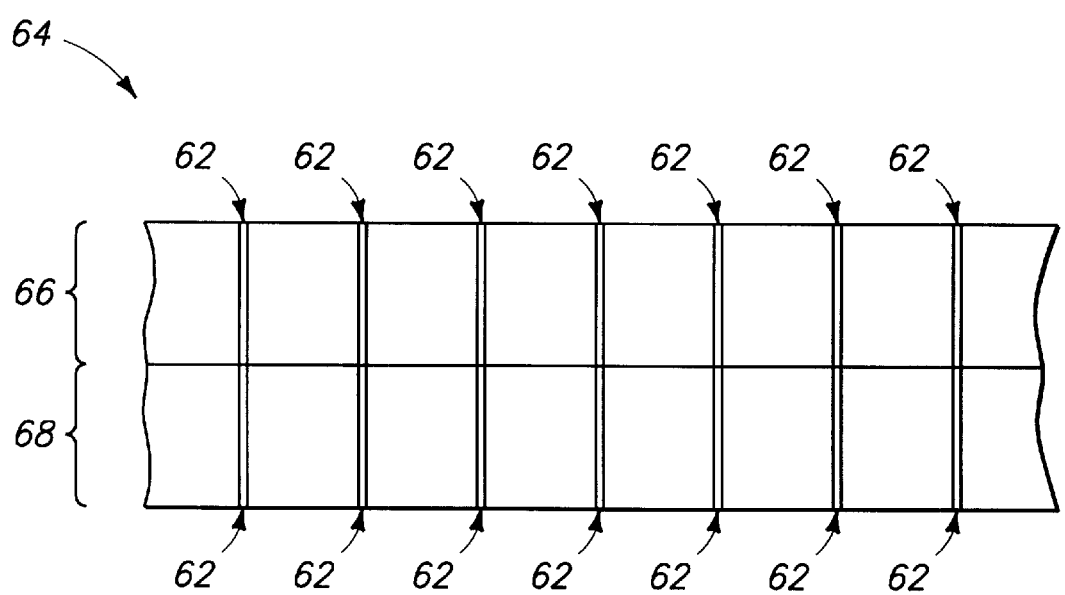
FIG. 12 is a reduced-scale, cross-sectional view of two semiconductor wafer fragments or dies in accordance with one aspect of the invention.

The above described methodology enables coaxial lines to be formed to extend through silicon wafers or even single dies or chips. Such allows signal interconnection between the front and back surfaces of such wafers, dies, or chips. An advantage of this methodology is that many dies or chips can be stacked on top of one another, and signals interchanged therebetween without having to separately package the die and mount the same on printed circuit boards. An exemplary configuration of such is shown in FIG. 12 generally at 64. There, a first substrate, die, or chip is indicated at 66. Such constitutes, in one aspect, an integrated circuitry-supportive substrate. A second die or chip is shown at 68. Similarly, such constitutes, in one aspect, an integrated circuitry-supportive substrate. Each such substrate is provided with a plurality of holes or passageways which extend through the entirety of at least one, and preferably both of such substrates. The illustrated holes are provided with appropriate coaxial interconnect lines 62 formed in accordance with the inventive methodology described just above. Intervening deformable conductive material can be provided between the substrates to facilitate a physical and electrical connection between the substrates and the coaxial lines formed therein. Although only two substrates or dies are shown, it will be understood that many substrates or dies could be similarly configured.

Referring to FIG. 13, a transmission line model is shown for one of the coaxial interconnections described just above. Such constitutes a short, lossy transmission line. Such is "short" because of the relatively small thickness of the silicon wafers or substrates. Such is "lossy" because of the finite resistance of, in one implementation, the diffusion region which forms the outer conductive coaxial line component.

The sheet resistance of such line component is about 10 ohms/square. The inductance L is the self-inductance of the center metal conductor, and the capacitance C, represents the capacitance of the cylindrical capacitor between the center metal conductor and the n+ conductor lining the hole. In a simple 50-ohm coaxial cable used in electronics, the outer conductor is also metal and the sheet resistance is neglected. Here however, a resistor R represents the finite conductivity and resistance of the outer n+ conductor. If no dielectric is used between the conductors, such as with free space, then the characteristic impedance $Z_0$ of the simple line with the two metal conductors of the simplest possible geometry is as shown in the figure. Normally, some dielectric material and geometric ratio is used so the characteristic impedance is 50 or 75 ohms. In the application just described, there is a correction by the amount $(1+jwRC)^{1/2}$, which accounts for the finite resistance of the n+ diffusion region. Normally, if the hole or passageway is lined with this n+ diffusion region, the wafer is not too thick, and the frequency is not too high, this latter term, wRC, will be small and less than 1. For example, if the wafer thickness is 4 mils or 100 microns, the outer radius $R_2$ is 1.6 microns, then the total resistance of the n+ diffusion region is 100 ohms. If the ratio $(\frac{1}{2}\pi)$ ln $(R_2/R_1)$ is around 1 and the dielectric constant of the insulator is about 4, then the total capacitance of the line is 3 fF. The product, RC, is then 0.3 ps. Accordingly, such means that even for frequencies in the Gigahertz range, the product wRC will be much less than 1. In the case where the hole or passageway is lined with metal for the outer conductive line component, there will be no corrective factor since the resistance is very small.

Huge potential savings are realized by not packing all individual silicon die or chips and mounting them on printed circuit boards. Instead, these dies or chips can be mounted one on top of the other, and a large of number of channels for interconnection of signals can be made available by the coaxial interconnect line through each individual die or chip.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. Integrated circuitry comprising a bulk semiconductive substrate having front and back surfaces and a plurality of conductive coaxial interconnect lines extending through the substrate from the front surface to the back surface; the conductive coaxial interconnect lines having aspect ratios of at least 100; the conductive coaxial lines respectively comprising an encircling outer conductive region, a region of dielectric material disposed radially inwardly of the encircling outer conductive region and coaxial with the outer conductive region, and conductive material cores disposed radially inwardly of the dielectric material and coaxial with the outer conductive region and the region of dielectric material.

2. The integrated circuitry of claim 1 wherein the encircling outer conductive regions respectively comprise a conductively doped region received within only a portion of the bulk semiconductive substrate and around the region of dielectric material.

3. The integrated circuitry of claim 2 wherein the bulk semiconductive substrate comprises bulk n-type monocrystalline silicon, the encircling outer conductive regions comprising n+ conductively doped regions in the n-type monocrystalline silicon.

4. The integrated circuitry of claim 1 wherein the encircling outer conductive regions comprise conductive metal.

5. The integrated circuitry of claim 1 wherein the dielectric region has a first thickness and the encircling outer conductive region has a second thickness, the first thickness being greater than the second thickness.

* * * * *